United States Patent

Cramer

[11] Patent Number: 5,929,649
[45] Date of Patent: *Jul. 27, 1999

[54] METHOD AND APPARATUS FOR ELECTRICAL PARASITIC MEASUREMENT OF PIN GRID ARRAY

[75] Inventor: Hans Thomas Cramer, San Jose, Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/633,249

[22] Filed: Apr. 18, 1996

[51] Int. Cl.$^6$ ............... G01R 1/04; H01R 13/66
[52] U.S. Cl. .......................... 324/761; 324/765
[58] Field of Search ............... 324/72.5, 754, 324/755, 761, 762, 158.1; 439/482, 620, 103, 109, 92; 174/207

[56] References Cited

U.S. PATENT DOCUMENTS 4,046,445  9/1977  Anhalt .................................. 439/109
4,668,041  5/1987  La Komski et al. .
4,866,375  9/1989  Malloy .................................. 324/761
5,451,883  9/1995  Staab .................................... 324/758

OTHER PUBLICATIONS

"Jedec Standard Proposal LCZ Measurement Method", May 17, 1995, pp. 1–20.

*Primary Examiner*—Vinh P. Nguyen
*Attorney, Agent, or Firm*—Skjerven, Morrill, MacPherson, Franklin & Friel LLP; Edward C. Kwok

[57] ABSTRACT

The present method and apparatus for electrically characterizing a pin grid array includes a plurality of conductive caps which may be removably fitted over chosen pins of the pin grid array, and a conductive fixture having a plurality of passages therethrough which correspond to the pins of the pin grid array. The passages are sized so that the caps come in close proximity to the fixture with the fixture so positioned on the pin grid array, while each pin which does not have a cap thereon is not in contact with the fixture but defines an air gap with the fixture. Electrical probing may then take place between the fixture, which connects a number of pins through the caps, and a pin not in contact with the fixture to gain electrical characterization information of the pin grid array.

12 Claims, 2 Drawing Sheets

METHOD AND APPARATUS FOR ELECTRICAL PARASITIC MEASUREMENT OF PIN GRID ARRAY

FIELD OF THE INVENTION

This invention relates to a method and apparatus for testing and measuring electrical characteristics of a pin grid array packages for characterization thereof.

BACKGROUND OF THE INVENTION

In present technology, a typical pin grid array for a complex semiconductor chip may include for example 296 pins, many of which are connected by a trace to a bond finger, each such bond finger being connectable to a pad on the chip by means of a wire bond.

The traces may be on different levels and may be appropriately connected by vias so that proper connection between a pin and a bond pad is achieved in a relatively compact package.

As is well known, it is important to electrically characterize the pin grid array itself, without the die in place. In furtherance thereof, a number of parameters of the pin grid array, such as input/output resistance, inductance, and capacitance, and power/ground, resistance, and capacitance must be measured.

A general description of such characterization is provided in the document "JEDEC STANDARD PROPOSAL LCZ MEASUREMENT METHOD", dated May 17, 1995, pages 1–20.

Typically, the electrical characterization of a pin grid array has been undertaken by first cutting off all the pins of the array, leaving the base of each pin exposed and substantially flush with the surface of the package material. Next, a body of solder is applied to all the exposed bases of the pins to short them together. Then, a small area of solder is melted and a vacuum gun is applied to draw some solder away so that a single pin base is exposed and no longer shorted to all the other pin bases. Electrical probes are then applied to the solder and exposed pin base respectively and electrical characterization tests are undertaken.

Then, in order to gain further characterization information of the pin grid array, the exposed pin base is again covered with solder to short it to all the other pin bases, and another area of the solder is melted and vacuumed away to provide that another pin base is exposed and not shorted to the other pin bases. The newly exposed pin base and solder are then probed and electrical tests are undertaken to gain further characterization information of the pin grid array.

This format is repeated in a wide variety of configurations in furtherance of achieving full pin grid array characterization.

In view of the large number of pin combinations that must be probed and tested in various ways to achieve complete device characterization, it is typical that for an array of this size, complete characterization may take, for example, one man-month to achieve.

In addition, using solder and a vacuum gun to achieve isolation of a pin base (or pin bases) is obviously unwieldy and also dangerous due to the heat involved in melting the solder and the fumes given off thereby.

SUMMARY OF THE INVENTION

The present method and apparatus for electrically characterizing a pin grid array includes a plurality of conductive caps which may be fitted over chosen pins of the pin grid array, and a conductive fixture having a plurality of passages therethrough which correspond to the pins of the pin grid array, the passages being sized so that the caps, when so fitted on pins, come in close proximity to the fixture with the fixture so positioned on the pin grid array, and the fixture contacts base portions of the caps, while each pin which does not have a cap thereon is not in contact with the fixture but defines an air gap with the fixture. Electrical probing may then take place between the fixture, which commonly connects a number of pins, and a pin not in contact with the fixture to gain electrical characterization information of the pin grid array. With the caps being removable from the pins, they may be installed on different pins as chosen.

DESCRIPTION OF THE PREFERRED EMBODIMENT

Figure 1:
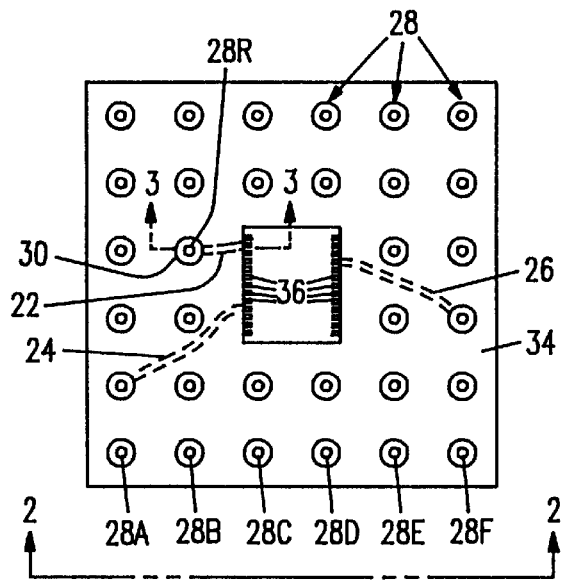
FIG. 1 is a plan view of a simplified pin grid array.
Figure 2:
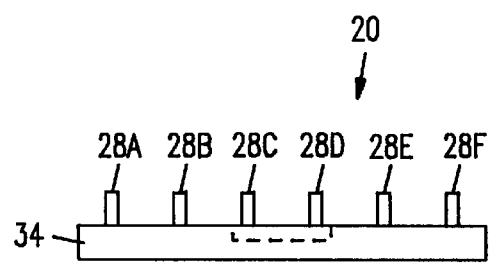
FIG. 2 is a view taken along the line 2—2 of FIG. 1.

Shown in FIGS. 1 and 2 are views of a simple pin grid array 20 including pins 28. It will be understood that while such pin grid array 20 of FIGS. 1 and 2 contains only a single layer of traces (examples shown at 22, 24, 26) and a minimal number of pins 28A, 28B, etc., i.e., in this example 32 pins, pin grid arrays with much greater numbers of pins and numerous layers of traces connected by vias are also well known. However, for purposes of this description, the simple pin grid array 20 of FIGS. 1 and 2 is sufficient.

Figure 3:
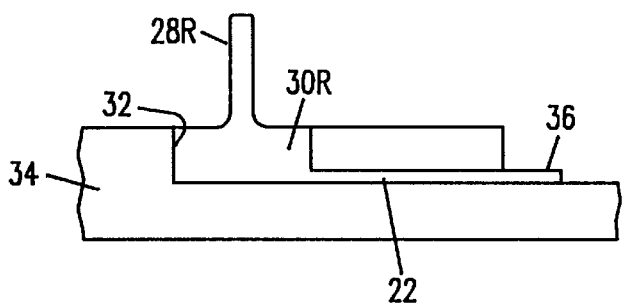
FIG. 3 is a sectional view taken along the line 3—3 of FIG. 1.

As is well known (FIG. 3), each pin (example, pin 28R) of the pin grid array 20 has a base portion 30R fitted into a passage 32 in for example a ceramic substrate 34, which base portion 30R is connected to a bond finger 36 on the substrate 34 by a conductive trace 22 (only some of the traces are shown in FIG. 1). Each of the bond fingers 36 is connectable to a pad on a semiconductor chip (not shown) by means of a wire bond.

A plurality of electrically conductive caps 38 (one shown in FIG. 4) are included in furtherance of this invention. Each cap 38 may be fitted closely on and in contact with a pin (for example pin 28R), and may be removed therefrom, the bottom surface 40 of the cap, when so fitted, contacting the top surface of the base 30R of the pin 28R, the inner bore 42 of the cap 38 being a close sliding fit over the outer surface of the pin 28R. Each cap 40 defines a base portion 41 the utility of which will be described.

Figure 5:
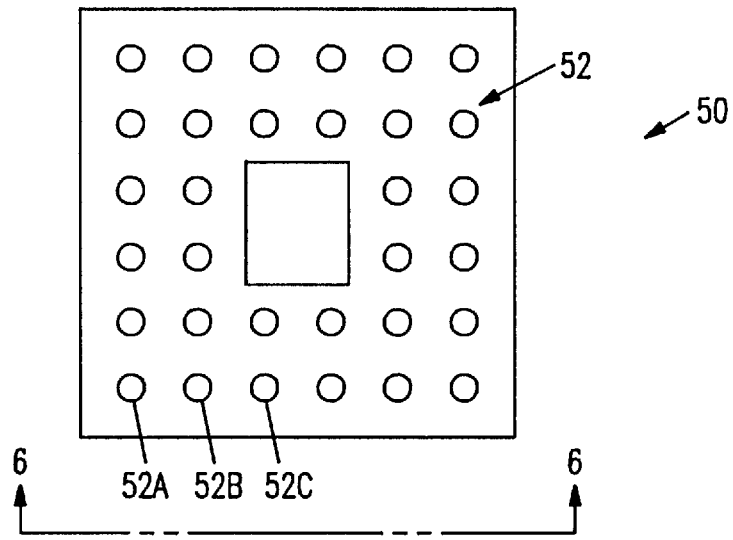
FIG. 5 is a plan view of a fixture in accordance with the present invention.
Figure 6:
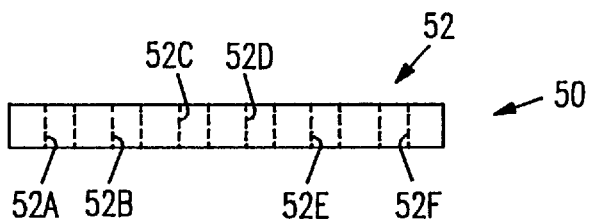
FIG. 6 is a view taken along the line 6—6 of FIG. 5.

Shown in FIGS. 5 and 6 is an electrically conductive fixture 50 used in furtherance of this invention. The fixture 50 has a plurality of passages 58, i.e., 52A, 52B, etc. therethrough which correspond to the positioning of the pins 28 of the pin grid array 20, i.e., 32 passages for 32 pins.

Figure 4:
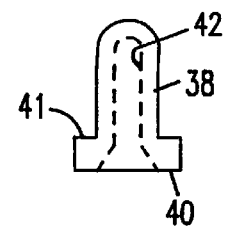
FIG. 4 is a side view of a cap placeable over an individual pin of the pin grid array.
Figure 7:
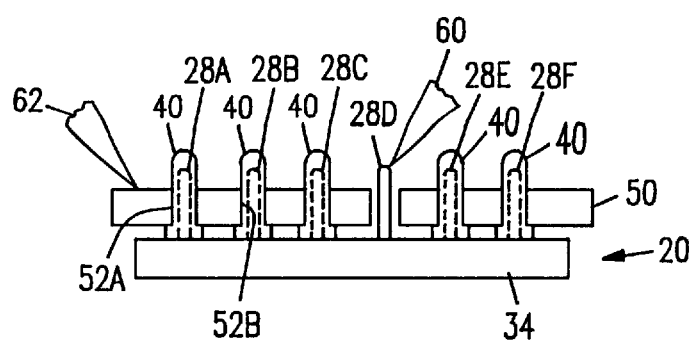
FIG. 7 is a sectional view showing the caps and fixtures in use.

Assuming, for example, that pins 28A, 28B, 28C, 28E, 28F are ground pins of the device, and pin 28D is a power pin, and that device characterization through probing of the pin 28D and ground is desired, a cap, 38 in accordance with FIG. 4 is placed over each of the ground pins 28A, 28B, 28C, 28E, 28F. Then (FIG. 7), the fixture 50 is placed over the pin grid array 20 and so-placed caps 38 so that each cap 40 is disposed in a passage 52, the caps 38 and passages 52 of the fixture 50 being configured so that each cap 38 is in close proximity to the fixture 50 and the fixture 50 is pressed down sufficiently so that it comes into contact with the base portions 41 of the caps 38. Thus, electrical connection is made between all of the ground pins 28A, 28B, 28C, 28E, 28F through the fixture 50.

Each of the passages 52 in the fixture 50 is configured so that if there is no cap 38 on a given pin 28, such pin 28 is disposed in a passage 52 of the fixture 50 without contacting the fixture 50, i.e., there is an air gap between the pin 28 and the fixture 50. This is true in the above example for the power pin 28D. Then, one probe 60 is placed on the pin 28D and the other probe 62 is placed on the fixture 50 and various electrical tests are run to characterize the array 20.

For further characterization to be undertaken, another power pin could be probed against ground, and appropriate electrical tests undertaken. Likewise, all of the power pins could have caps placed over them, with the remaining ground pins exposed, and with the fixture 50 in place so that all the power pins are commonly connected through the fixture 50, each individual ground pin can be probed against the fixture. In addition, with caps 38 placed over appropriate pins 28, wire bonds could be provided as appropriate between bond fingers 36, and probe tests run until a full characterization of the device 20 as chosen can be achieved.

It will readily be seen that through use of the removable caps 38 and a fixture 50 various combinations can be achieved easily and rapidly so that full characterization of a device 20 can be achieved in much less time than in the previously described system. In addition, the present system avoids the use of solder as described above and the problems attendant thereto.

I claim:

1. An apparatus for use in testing a pin grid array package, the pin grid array package having a base portion and a plurality of pins, the apparatus comprising:

a fixture, having a first surface and a second surface, the second surface being electrically conductive, defining a plurality of passages therethrough, formed in such a manner that the fixture can be removably placed on the pin grid array package with one surface of the fixture facing with the base of the pin grid array package, and to allow a portion of each pin of the pin grid array to protrude beyond the second surface through a corresponding one of the passages without causing the pins of the pin grid array to electrically couple to the second surface; and a conductive member removably placeable on the protruding portion of a selected pin of the pin grid array, the member being configured such that, when the fixture is placed on the pin grid array package and with the member so placed on the selected pin, the selected pin is electrically coupled to the second surface of the fixture.

2. The apparatus of claim 1 wherein the member defines a base portion which contacts the second surface of the fixture.

3. The apparatus of claim 1 wherein the member is a cap member.

4. An apparatus for use in testing a pin grid array package, the pin grid array package having a base portion and a plurality of pins, the apparatus comprising:

a fixture, having a first surface and a second surface and defining a plurality of passages therethrough, the second surface being electrically conductive, each passage corresponding to a pin of the pin grid array, the fixture being formed in such manner as to allow the fixture to be positioned in close proximity to the pin grid array package with the first surface facing the base portion of the pin grid array package and a portion of each of the pins to protruding beyond the second surface through a corresponding one of the passages without creating an electrically conducting path between each of the pins and the second surface of the fixture; and wherein the portion of each pin of the pin grid array protruding beyond the second surface is formed in such a manner to allow being placed thereon a member which is configured to provide an electrical path between the pin and the second surface of the fixture when the fixture is so positioned.

5. The apparatus of claim 4 wherein the member defines a base portion which contacts the second surface of the fixture with the member on a pin and disposed in a first passage.

6. The apparatus of claim 4 wherein the member is a cap member.

7. An apparatus for use in testing a pin grid array assembly, the pin grid array assembly having a base portion and a plurality of pins, the apparatus comprising:

a fixture having a first surface and a second surface and defining a plurality of passages therethrough, each passage corresponding to a pin of the pin grid array, the second surface being electrically conductive, formed in such a manner that the fixture can be positioned in close proximity to the pin grid array assembly with the first surface facing the base portion of the pin grid array assembly and a portion of each of the pins of the pin grid array assembly protruding beyond the second surface without creating an electrical path between the pins and the second surface of the fixture;

a plurality of conductive members removably placeable on the protruding portions of selected pins of the pin grid array assembly, the members being configured to create an electrical path coupling the selected pins to the second surface of the fixture.

8. The apparatus of claim 7 wherein each of the members defines a base portion which contacts the second surface of the fixture.

9. A method of testing a pin grid array package, the pin grid array package having a base portion and a plurality of pins, the method comprising:

providing a fixture on the pin grid array package, the fixture having a first surface and a second surface and a plurality of passages formed therethrough, the second surface being electrically conductive, the fixture formed in such a manner to allow the fixture to assume a position in close proximity to the pin grid array package in which the first surface faces the base portion of the pin grid array package and the pins protrudes through the passages beyond the second surface;

placing a conductive member on the protruding portion of a selected pin of the pin grid array, the conductive member being formed such that, when so placed, the conductive member provides an electrical path between the selected pin and the second surface of the pin grid array package; and conducting an electrical test involving the selected pin and a second pin on the pin grid array.

10. The method of claim 9 wherein the member is removably placed on the selected pin.

11. A method of testing a pin grid array package, the pin grid array package having a base portion and a plurality of pins, the method comprising:

removably placing conductive members on a selected first plurality of pins of the pin grid array package, the conductive members formed in such a manner that each conductive member encloses a selected portion of the first plurality of pins of the pin grid array package;

placing a fixture on the pin grid array so that the so placed conductive members are disposed respectively in passages defined by the fixture, said fixture having a first surface and a second surface, with said second surface being electrically conductive, said fixture being placed in such a manner that said first surface faces said base portion of said pin grid array package and said selected portions of said first plurality of pins protruding beyond said second surface, and with said second surface being in electrical contact with said conductive members, thereby electrically coupling the first plurality of pins of the pin grid array to each other and conducting an electrical test involving the plurality of pins and a selected one of the remaining pins.

12. The method of claim 11 and further providing that each member defines a base portion which is contacted by the fixture with the fixture so placed on the pin grid array.

* * * * *

UNITED STATES PATENT AND TRADEMARK OFFICE
CERTIFICATE OF CORRECTION

PATENT NO.    : 5,929,649                              Page 1 of 1
DATED         : July 27, 1999
INVENTOR(S)   : Cramer, Hans T.

It is certified that error appears in the above-identified patent and that said Letters Patent is hereby corrected as shown below:

Column 3,
Line 4, delete "40" insert -- 38 --

Column 4,
Lines 64-65, delete "pin grid away package" insert -- fixture --

Signed and Sealed this

Twenty-sixth Day of February, 2002

Attest:

Attesting Officer

JAMES E. ROGAN
Director of the United States Patent and Trademark Office